(12) United States Patent  
DiPiazza

(10) Patent No.: US 6,600,294 B1  
(45) Date of Patent: Jul. 29, 2003

(54) SWITCHED REACTANCE PHASE SHIFTERS

(75) Inventor: Gerald Charles DiPiazza, Edenton, NC (US)

(73) Assignee: Tyco Electronics Corp., Middletown, PA (US)

( * ) Notice: Subject to any disclaimer, the term of this patent is extended or adjusted under 35 U.S.C. 154(b) by 29 days.

(21) Appl. No.: 10/055,527

(22) Filed: Jan. 23, 2002

(51) Int. Cl.[7] .............................. G05F 1/00; G05F 3/00
(52) U.S. Cl. ........................................ 323/212; 323/210
(58) Field of Search ................................. 323/212, 211, 323/210; 363/40, 41, 39, 44, 48; 455/78, 80, 83

(56) References Cited

U.S. PATENT DOCUMENTS

| | | | |
|---|---|---|---|
| 4,234,843 A | * 11/1980 | Gyugyi et al. ............... | 323/210 |
| 4,621,198 A | * 11/1986 | Roberge et al. ............. | 323/211 |
| 4,939,486 A | * 7/1990 | Bergdahl et al. ............ | 333/175 |
| 5,032,738 A | * 7/1991 | Vithayathil ................. | 307/112 |
| 5,446,424 A | 8/1995 | Pierro ......................... | 333/104 |
| 5,625,894 A | * 4/1997 | Jou ............................. | 455/78 |

\* cited by examiner

Primary Examiner—Rajnikant B. Patel

(57) ABSTRACT

A phase shifter is disclosed in which parasitic elements in a microelectromechanical system (MEMS) switch are designed and utilized to provide a predetermined phase shift. In one embodiment, a circuit containing three MEMS switching modules, each of which includes a pair of series-coupled reactances is described. The first reactance is determined by an inductor, the second by a capacitor representing the MEMS switch contact in either the up or down positions, and wherein the capacitive reactance is greater than the inductive reactance for the MEMS switch contact in the up position and less than the inductive reactance for the MEMS switch in the down position. The three MEMS switching modules are configured such that a switched high pass/low pass phase shifter topology can be realized with the appropriate actuation of the MEMS switch contacts.

In another embodiment, two MEMS switching modules, that include two series-coupled reactances, are coupled via tuning stubs, each having a predetermined electrical length, to a main transmission line. The first reactance is determined by an inductor, the second by a capacitor representing the MEMS switch contact in either the up or down positions, and wherein the capacitive reactance is greater than the inductive reactance for the MEMS switch contact in the up position and less than the inductive reactance for the MEMS switch in the down position. Each of the two tuning stubs is coupled to the main transmission line in a spaced apart configuration having a predetermined electrical distance from one another.

27 Claims, 6 Drawing Sheets

SWITCHED REACTANCE PHASE SHIFTERS

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

Millimeter wave (MMW) phase and delay shifters are used for a variety of applications that include narrowband to broadband, electronically steerable array antenna systems. The system requirements for these antennas have become more stringent and require phase and delay shifters that are power-efficient, have a low insertion loss, are size conservative, and operate over narrow to broad bandwidths. One class of electronic steering means are referred to as phase shifters and this class of electronic steering means is substantially different from the class of electronic steering means that are referred to as delay shifters. The phase shifter steering means, are generally applicable for narrow to moderate bandwidth antenna system applications while the delay shifter steering means are generally utilized in very broadband antenna system applications.

Typically, phase shifter circuits have used PIN diodes or Field Effect Transistors (FETs) as the active switching devices. FETs have gained popularity as microwave (MW) and MMW switches due to their very low current consumption and small size. Although PIN diodes have very fast switching speeds relative to FETs and other switching devices, they require a holding current to maintain the PIN diode in a low loss "on" state. In a high power antenna array system, PIN diodes may consume a large amount of aggregate bias power to maintain each forward biased PIN diode at a sufficiently low resistance. PIN diodes and the FETs that are used as switches also have junction capacitances that limit their isolation and, hence, their performance for phase shifter applications at MMW frequencies.

For some applications, particularly large MMW receive antennas, microelectromechanical Systems (MEMS) switch technology has become an attractive alternative to implement the necessary switching functions in phase shifter circuits and systems. A MEMS realized switching module consumes nearly zero bias current, which is much less when compared to PIN diode switching modules, and, has significantly better insertion loss performance than the solid-state alternatives. However, MEMS switching devices have significantly lower switching speeds and lower power-handling characteristics compared with their solid-state counterparts, FETs and PIN diodes.

MEMS switches along with the associated components needed for a phase shifter on a chip may require a very large chip-level surface area compared to the area required by solid state switches. Thus phase shifters using current MEMS switch-based technology are prone to be more expensive than other phase shifter approaches and are unable to meet certain space requirements due to their comparatively increased size.

Therefore, it would be advantageous to provide a phase shifter approach, using MEMS technology, that obviates the need for the large amount of chip surface area they currently require. Additionally, it would be advantageous to enable a MEMS technology that enhances power handling capability when compared to the prior art.

BRIEF SUMMARY OF THE INVENTION

A phase shifter is disclosed in which parasitic elements in a microelectromechanical switch (MEMS) are designed and utilized to provide a predetermined phase shift of a signal of interest. In one embodiment, a phase shifter circuit uses three MEMS switching modules, each of which includes first and second predetermined reactances. The first predetermined reactance is in an electrically parallel configuration with a second predetermined reactance that is in series with an ideal switch. The second reactance is selected to be less than the first reactance, at the center frequency of the signal of interest. The three MEMS switching modules are configured such that a high pass/low pass phase shifter topology can be implemented with the appropriate orientation of the ideal switches.

A phase shifter is disclosed in which parasitic elements in a microelectromechanical system (MEMS) switch are designed and utilized to provide a predetermined phase shift. In one embodiment, a circuit containing three MEMS switching modules, each of which includes a pair of series-coupled reactances is described. The first reactance is determined by an inductor, the second by a capacitor representing the MEMS switch contact in either the up or down positions, and wherein the capacitive reactance is greater than the inductive reactance for the MEMS switch contact in the up position and less than the inductive reactance for the MEMS switch in the down position. The three MEMS switching modules are configured such that a switched high pass/low pass phase shifter topology can be realized with the appropriate actuation of the MEMS switch contacts.

In another embodiment, two MEMS switching modules, that include two series-coupled reactances, are coupled via tuning stubs, each having a predetermined electrical length, to a main transmission line. The first reactance is determined by an inductor, the second by a capacitor representing the MEMS switch contact in either the up or down positions, and wherein the capacitive reactance is greater than the inductive reactance for the MEMS switch contact in the up position and less than the inductive reactance for the MEMS switch in the down position. Each of the two tuning stubs is coupled to the main transmission line in a spaced apart configuration having a predetermined electrical distance from one another.

Other forms, features and aspects of the above-described methods and system are described in the detailed description that follows.

BRIEF DESCRIPTION OF THE SEVERAL VIEWS OF THE DRAWING

The invention will be more fully understood by reference to the following Detailed Description of the Invention in conjunction with the Drawing of which.

DETAILED DESCRIPTION OF THE INVENTION

Figure 1:
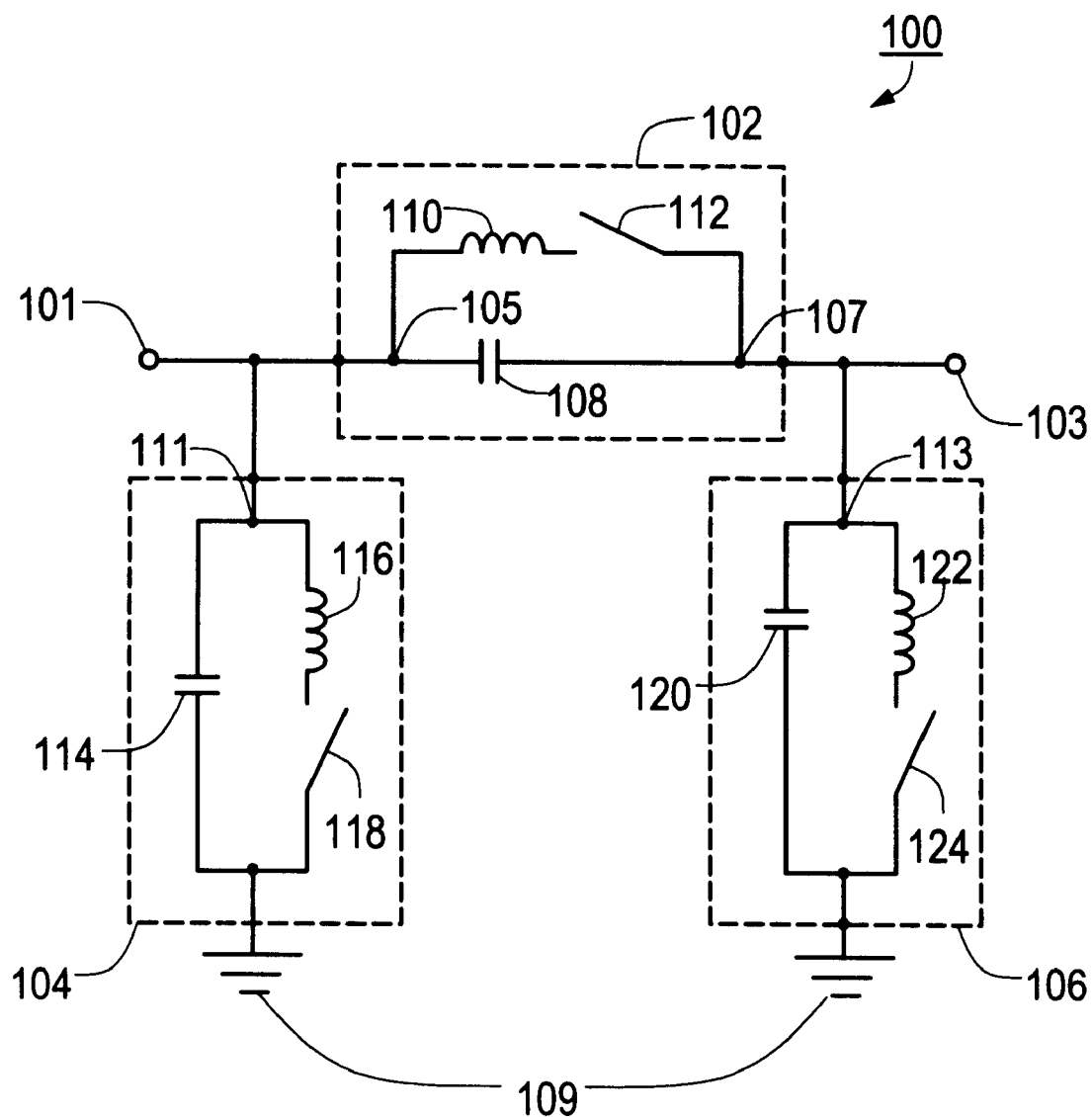
FIG. 1 is a schematic diagram of one embodiment of a phase shifter according to the present invention.

A phase shifter employing switched reactances using micro electromechanical switches (MEMS) is illustrated in FIGS. 1–7. FIG. 1 depicts one embodiment of a phase shifter 100 that includes three MEMS switching modules 102, 104, and 106 that are designed such that the contact structures have specific contact to contact reactances. The capacitance and inductance values are selected as a function of the insertion phase shift desired of the signal of interest when the contacts are switched. The phase shifter 100 includes an input 101 and output 103, wherein the switching module 102 is connected in series between the phase shifter input 101 and the phase shifter output 103. The first switching module 102 includes a switching input 105 and switching output 107, a first reactance 108 connected in series between the input 105 and output 107 and a second reactance 110 connected in series with a switch 112, wherein the second reactance 110 and the switch 112 are connected in series between the input 105 and output 107 and parallel to the first reactance. In the embodiment depicted in FIG. 1, the first reactance 108 is a capacitor and the second reactance 110 is an inductor. Alternatively, the first reactance 108 could be an inductor and the second reactance 110 could be a capacitor.

The second switching module 104 is coupled in a shunt configuration between the phase shifter 101 and a common reference voltage 109 which is usually ground. The second switching module 104 includes an input 111, a third reactance 114 connected in series between the input 111 and the common voltage reference 109, and a fourth reactance connected in series with a switch 118 that are both connected in series between the input 111 and the common voltage reference 109 and parallel to the third reactance. In the embodiment depicted in FIG. 1, the third reactance 114 is a capacitor and the fourth reactance 116 is an inductor. Alternatively, the first reactance 114 could be an inductor and the second reactance 116 could be a capacitor.

A third switching module 106 is connected in a shunt configuration between the phase shifter output 103 and the common voltage reference 109. The third switching module 106 includes an input 113, a fifth reactance 120 connected in series between the input 113 and the common voltage reference 109, and a sixth reactance 122 connected in series with a switch 124 that are both connected in series between the input 113 and the common voltage reference 109 and parallel to the fifth reactance. In the embodiment depicted in FIG. 1, the fifth reactance 120 is a capacitor and the sixth reactance 122 is an inductor. Alternatively, the fifth reactance 120 could be an inductor and the sixth reactance 122 could be a capacitor.

In the embodiment depicted in FIG. 1, the MEMS switching modules 102, 104, and 106 are capacitive when the corresponding switch is open and a combination of capacitive and inductive when the corresponding switch is closed. It is however, desirable that the MEMS switching module appears inductive when the corresponding switch is closed. By selecting the values of the capacitor and inductor such that the capacitive reactance at the frequency of interest is greater than the inductive reactance at the frequency of interest, more power will flow through the inductance. Accordingly, the MEMS switching module would appear to be inductive when the corresponding switch is closed. Typically, the values of the inductor and capacitor are selected such that the capacitive reactance is two or more times greater than the inductive reactance.

As depicted in FIG. 1, the topology of the three MEMS switches 102, 104, and 106 is selected to create a high pass/low pass phase shifter. In particular, the series switch 112 is switched simultaneously and out of phase with the two shunt switches 118 and 124. That is, when the series switch 112 is closed, the two shunt switches 118 and 124 will be open forming a low pass phase shifter. Similarly, when the series switch 112 is open, the two shunt switches 118 and 124 will be closed forming a high pass phase shifter.

The phase shifter 100 can be cascaded with other phase shifter modules to provide for broadband phase. shifter applications. As depicted in FIG. 1 only three MEMS switching modules are necessary to implement a single phase shift bit. Since the shunt switches 118 and 124 are switched together, the switching of all three MEMS switching modules 102, 104, and 106 may be accomplished using only two electrostatic actuators: one for the series switch 112 and one for the two shunt switches 118 and 124.

Figure 2:
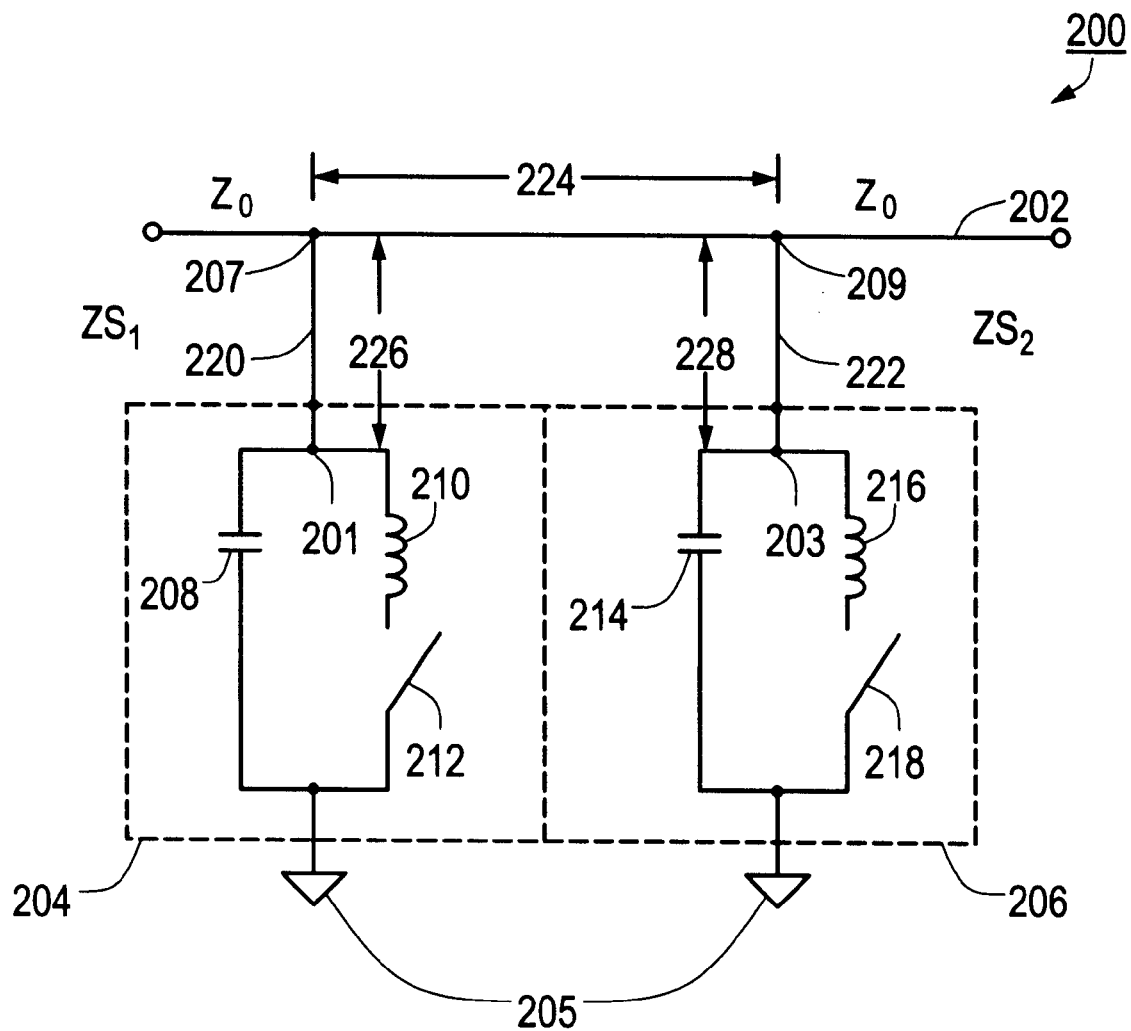
FIG. 2 is a schematic diagram of another embodiment of a phase shifter according to the present invention.

FIG. 2 depicts a phase shifter 200 in which two or more shunt stubs are used to transform the MEMS switched reactances loading each shunt stub end to a predetermined value. The two stubs are coupled to a main transmission line a predetermined distance apart to achieve a desired impedance effect. In particular, the phase shifter 200 includes a main transmission line 202, which has a characteristic impedance $Z_0$, and first and second shunt stubs 220 and 222 having characteristic impedances of $Z_{s1}$ and $Z_{s2}$ respectively. The first shunt stub 220 is coupled to the main transmission line 202 at a first location 207, and the second shunt stub 222 is coupled to the main transmission line 202 at a second location 209. The first and second locations 207 and 209 are spaced apart from one another a predetermined electrical distance 224. Each of the shunt stubs 220 and 222 are further coupled to first and second MEMS switching module 204 and 206 respectively.

The first MEMS switching module 204 includes a first reactance 208 connected in series between the free end of the stub 201 and a common voltage reference 205, which is usually ground. The MEMS switching module 204 also includes a second reactance 210 in series with a first switch 212, and wherein both the second reactance and switch are connected in series between the free end of the stub 201 and the common voltage reference 205 and parallel to the first reactance 208.

The second MEMS switching module 206 includes a third reactance 214 connected in series between the free end of the shunt stub 203 and the common voltage reference 205, and a fourth reactance 216 in series with a switch 218, the combination of which is connected in series between the free end of the shunt stub 203 and the common voltage reference point 205.

In the illustrated embodiment in FIG. 2 the first and second shunt stubs 220 and 222 are preferably spaced apart from one another by a distance 224 that is equal to a quarter wavelength, or an odd numbered multiple thereof, of the center frequency of interest along the main transmission line 202. Similarly, each of the shunt stubs 220 and 222 both have lengths 226 and 228 respectively that are an electrical quarter wavelength long at the frequencies of interest along the shut stub.

In a preferred embodiment the MEMS switching device 204 and 206 are identical, in that the first reactance 208 of the first MEMS switching device 204 is equal to the third reactance 214 of the second MEMS switching device 206. Similarly, in this preferred embodiment, the second reactance 210 of the first MEMS switching device 204 is equal to the fourth reactance 216 of the second MEMS switching device 206. In this preferred embodiment the first and second switches 212 and 218 are switched in phase with one another and as such the same electrostatic actuator (not shown) can be used to activate the switches 212 and 218 substantially simultaneously. All the MEMS devices may be identical regardless of the desired phase shift value and any differences in value can be accomplished using the quarter wavelength stub transformer. For the illustrated embodiment in FIG. 2 the phase shift, return loss, peak voltage and current are all dependent upon the magnitude of the switched suceptances at the main transmission path junctions 207 and 209.

The phase shifter 200 can also be cascaded with other phase shifter modules to provide for broadband phase shifter applications. For example, in one embodiment in which the peak power to be transmitted through the phase shifter 200 limited the phase shift bit value to twenty two and one-half degrees, a six bit phase shifter was created using six twenty two and one-half degrees phase shift modules. By limiting the magnitude of the switched suceptances for any one bit and cascading smaller phase shifts to realize larger ones, broad bandwidth with performance and high power handling capabilities can be achieved.

Figure 3A:
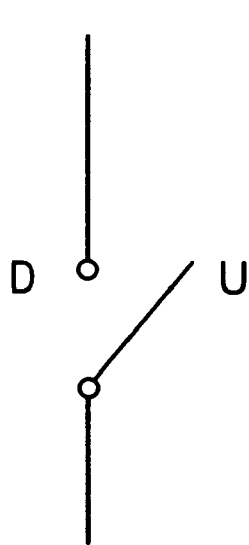
FIGS. 3A–3B are schematic diagrams of a form of a MEMS switch.
Figure 3B:
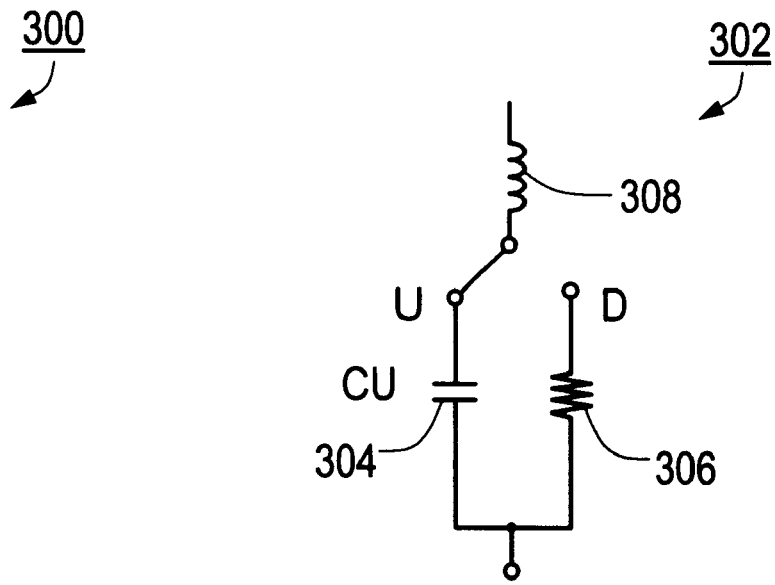

FIGS. 3A–3B depicts another model of a MEMS switch at millimeter wave frequencies. The MEMS switch includes a direct, micro-scale, metal-to-metal, switch contact wherein the switch contact area is represented by a very low resistance that, ideally, would be zero. The insertion loss of such a switch at MMW frequencies is very low. However, such resistive contact structures may have reliability issues associated with the long-term stability of micro-scale, metal-to-metal contacts. FIGS. 3(a) and 3(b) illustrate the ideal and the parasitic models, respectively, for such a MEMS switch at MMW frequencies. In particular, FIG. 3A depicts an ideal switch 300 having an infinite resistance when open and a zero resistance when closed. FIG. 3B depicts a parasitic model of a direct, micro-scale, metal-to-metal switch contact. In particular, FIG. 3B depicts a switch 302 having a first reactance in series with a second reactance, wherein the second reactance is switchable between two values. The two values of the second reactance are determined by the capacitor Cu 304 represents the capacitance of the contact in the open or up position and the resistor r 306 represents the contact resistance when the contact is in the closed or down position. The parasitic inductance 308, represents the finite length and, hence, the series inductance of the MEMS switch at MMW frequencies.

Figure 4A:
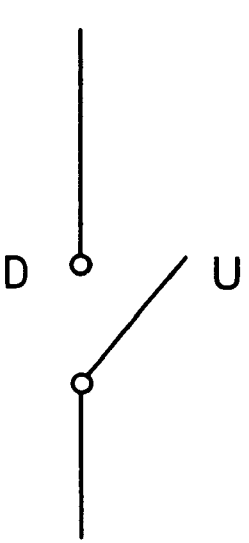
FIGS. 4A–4B are schematic diagrams of another form of a MEMS switch.
Figure 4B:
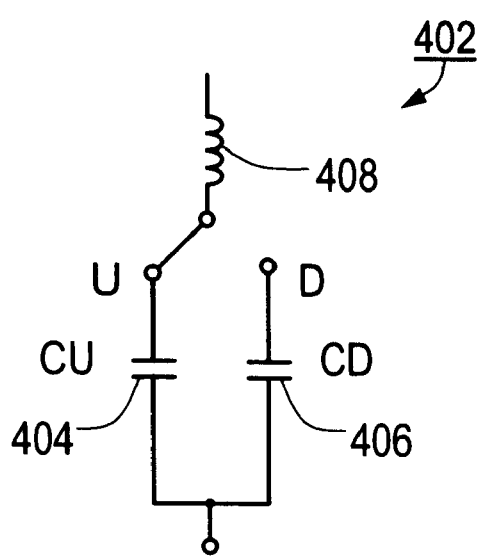

FIGS. 4A–4B depict a second electrical model for a MMW MEMS switch. The model depicted in FIGS. 4A–4B is that of a switched capacitance wherein the contact area is a metal-insulator-metal (MIM) reactive contact that, ideally, would be zero when the switch contact is in the closed or down position. FIG. 4A depicts an ideal model 400 for a switch at MMW frequencies having zero impedance when closed and an infinite impedance when open. FIG. 4B depicts a switch 402 having a first reactance in series with a second reactance, wherein the second reactance is switchable between two values. The first value is determined by the capacitance Cu 406, which represents the capacitance of the switch contact in the open or up position and the second value is determined by the capacitance Cd 406, which represents the capacitance of the switch contact in the closed or down position. Advantageously, this particular MEMS switch contact realization may be more reliable than its metal-to-metal counterpart because it eliminates the direct metal-to-metal contact. In the description of the embodiments that follow this form of the MEMS switch that utilizes a MIM contact will be employed. However, it should be realized that the MEMS switch using the metal-to-metal contact depicted in FIGS. 3A–3B could be used, with relatively minor the switch module architecture.

Figure 5:
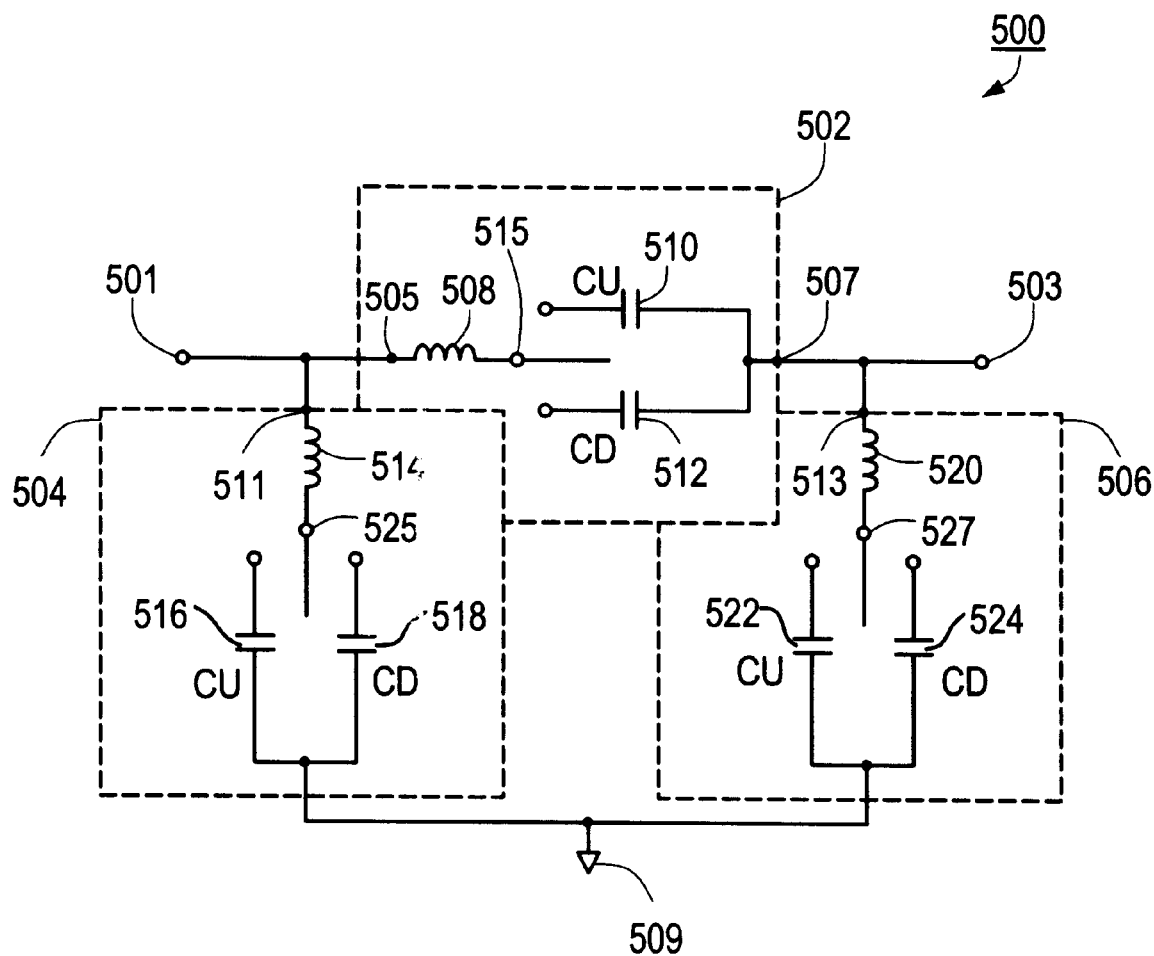
FIG. 5 is a schematic diagram of another embodiment of a phase shifter using the MEMS switch depicted in FIGS. 4A–4B.

FIG. 5 depicts an embodiment of a phase shifter employing switched reactances using microelectromechanical systems (MEMS) switching technology. In particular, FIG. 5 depicts a phase shifter 500 that includes three MEMS switching modules 502, 504, and 506. The three switching modules are arranged such that switching module 502 is connected in series between first and second shunt switching module 504 and 506 respectively. Each of the switching modules 502, 504 and 506 are designed such that the contact structures have specific contact to contact capacitances, Cu and Cd, for each of the two MEMS switch states. Accordingly, capacitors 510 and 512 correspond to switching module 502, capacitors 516 and 518 correspond to switching module 504, and capacitors 522 and 524 correspond to switching module 506. Each of the switching modules 502, 504, and 506 further includes a series inductor having a predetermined inductance that is selected as a function of the insertion phase shift desired of the signal of interest when the contacts are switched. Accordingly, series inductance 508 corresponds to switching module 502, series inductance 514 corresponds to switching module 504, and series inductance 520 corresponds to switching module 506. The phase shifter 500 includes an input 501 and output 503, wherein the series switching module 502 is connected in series between the phase shifter input 501 and the phase shifter output 503. In addition, the first shunt switching module 504 is connected to a switching input 505 of the switching module 502 shunting the input 501. Furthermore, the second shunt switching module 506 is connected to a switching output 507 of the switching module 502 shunting the output 503.

The first switching module 502 includes a switching input 505 and a switching output 507, a first inductive reactance 508 connected in series between the input 505 and a switching node 515. A second reactance is in series with the first inductive reactance 508 and is determined by first and second capacitances Cu 510 and Cd 512 are the switch contact reactance of the MEMS switching contacts. As discussed above, the capacitive reactance Cu 510 is the value of the capacitive reactance when the switching node 515 is in the up or open position, and the capacitive reactance Cd 512 is the value of the capacitive reactance when the switching node 515 is in the down or closed position.

Similarly, the first shunt switching module 504 includes the switching input 511 and the switching output 509 connected to ground, a first inductive reactance 514 connected in series between the input 511 and a switching node 525. A second reactance is in series with the first inductive reactance 514 and is determined by first and second capacitances Cu 516 and Cd 518, where Cu 516 and Cd 518 are the switch contact reactance of the MEMS switching contacts. As discussed above the capacitive reactance Cu 516 is the value of the capacitive reactance when the switching node 525 is in the up or open position, and the capacitive reactance Cd 518 is the value of the capacitive reactance when the switching node 525 is in the down or closed position.

The second shunt switching module 506 similarly includes the switching input 513 and the switching output 509 connected to ground, a first inductive reactance 520 connected in series between the input 513 and a switching node 527. A second reactance is in series with the first inductive reactance 520 and is determined by first and second capacitances Cu 522 and Cd 524, where Cu 522 and Cd 524 are the switch contact reactance of the MEMS switching contacts. As discussed above the capacitive reactance Cu 522 is the value of the capacitive reactance when the switching node 527 is in the up or open position, and the capacitive reactance Cd 524 is the value of the capacitive reactance when the switching node 527 is in the down or closed position.

In the embodiment depicted in FIG. 5, the MEMS switching modules 502, 504, and 506 are capacitive when the corresponding MEMS switch contact is up or open and inductive when the corresponding MEMS switch contact is down or closed. Typically, the values of the inductor and capacitors are determined such that the capacitive reactance, when the switch contact is open or in the up position, is two or more times greater than the inductive reactance at the center of the frequency band of interest. As depicted in FIG. 5, the topology of the three MEMS switches 502, 504, and 506 is designed to simulate the insertion phase properties of a switched high-pass and low-pass network that when properly activated creates the desired phase shift value. In particular, the series switch module, 502, is switched simultaneously and out of phase with the first and second shunt switch modules, 504 and 506 respectively. That is, when the series MEMS switch contact 515 is closed or down Cd, 512, is selected. Accordingly, the two shunt MEMS switch contacts 525 and 527 in modules 504 and 506 respectively will be open or up and the Cu 516 and Cu 522 are selected. Thus forming a matched low-pass phase shift network. Similarly, when the series MEMS switch contact 515 is open or up Cu, 510, is selected. Accordingly, the two shunt MEMS switch contacts 525 and 527 in modules 504 and 506 will be closed or down and the Cd 518 and Cd 524 are selected. Thus forming a matched high-pass phase shift network.

The phase shifter, 500, can be cascaded with other phase shifter modules to synthesize the appropriate number of phase shift bits required by the application. Such phase shift topologies can accommodate narrow to moderate bandwidth antenna system requirements. As depicted in FIG. 5 only three MEMS switching modules are necessary to implement one phase shift bit of the phase shifter. Since the shunt switch modules, 504 and 506 are switched together, the switching of all three MEMS switching modules 502, 504, and 506 may be accomplished using only two electrostatic actuators. One actuator can be used to switch the series switch module, 502, and the other actuator can be used for the first and second shunt switch modules, 504 and 506.

Figure 6:
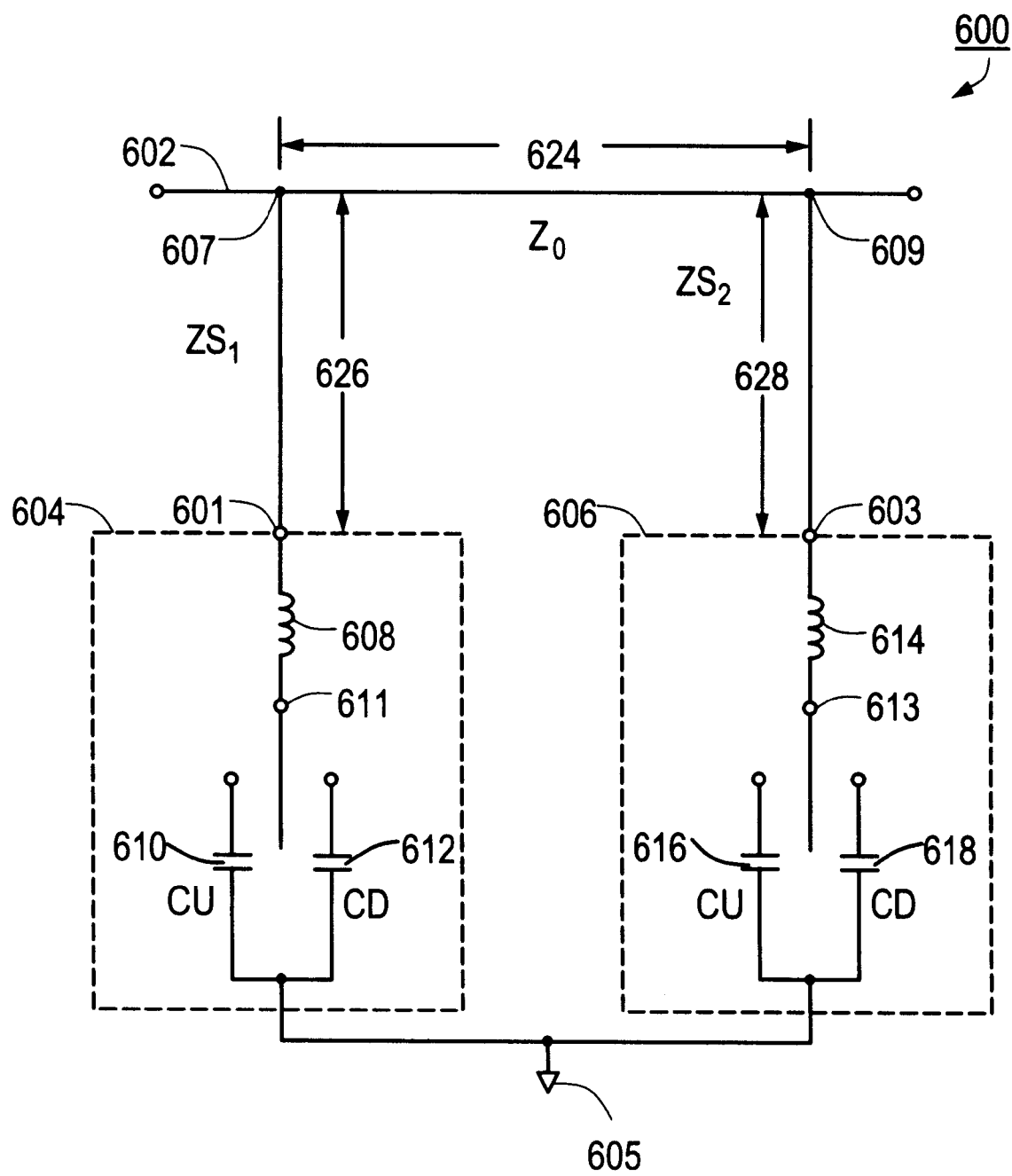
FIG. 6 is a schematic diagram of another embodiment of a phase shifter using the MEMS switch depicted in FIGS. 4A–4B.

FIG. 6 depicts another embodiment of a phase shifter described herein. As depicted in FIG. 6, phase shifter 600 includes first and second shunt stubs 620 and 622 respectively that transform the MEMS reactances on the end of each respective shunt stub to a predetermined value at the junction of the shunt stub and the transmission line. The first and second shunt stubs 620 and 622 are coupled to a main transmission line 602 at first and second nodes 607 and 609 respectively. The first and second nodes 607 and 609 are spaced apart a predetermined electrical distance 624 to achieve a desired impedance match. The main transmission line 602 has a characteristic impedance $Z_0$, and first and second shunt stubs 620 and 622 having characteristic impedances of $Z_{s1}$ and $Z_{s2}$ respectively. Each of the shunt stubs 620 and 622 are further coupled to first and second MEMS switching modules 604 and 606 respectively at nodes 601 and 603 respectively.

The first switching module 604 includes the switching input 601 and the switching output 605 coupled to ground, a first inductive reactance 608 connected in series between the input 601 and a switching node 611. A second reactance is in series with the first inductive reactance 608 and is determined by first and second capacitances Cu 610 and Cd 612, where Cu 610 and Cd 612 are the switch contact reactances of the MEMS switching contacts. As discussed above the capacitive reactance Cu 610 is the value of the capacitive reactance when the switching node 611 is in the up or open position, and the capacitive reactance Cd 612 is the value of the capacitive reactance when the switching node 611 is in the down or closed position.

The second switching module 606 includes the switching input 603 and the switching output 605 coupled to ground, a first inductive reactance 614 connected in series between the input 603 and a switching node 613. The first reactance is in series with a second reactance that is switchable between two values. The two values are determined by the first and second capacitors Cu 616 and Cd 618, where first and second reactances Cu 616 and Cd 618 are the switch contact reactances of the MEMS switching contacts. As discussed above the capacitive reactance Cu 616 is the value of the capacitive reactance when the switching node 613 is in the up or open position, and the capacitive reactance Cd 618 is the value of the capacitive reactance when the switching node 613 is in the down or closed position.

In the embodiment illustrated in FIG. 6, the first and second shunt stubs 620 and 622 are preferably spaced apart from one another by an electrical distance 624 that is equal to a quarter wavelength at the center frequency of interest along the main transmission line 602. Similarly, each of the shunt stubs 620 and 622 both have lengths 626 and 628 respectively that are an electrical quarter wavelength at the center frequency of interest along the stub transmission lines 620 and 622.

In a preferred embodiment the MEMS switching devices, 604 and 606 are identical, in that the inductive reactance 608 of the first MEMS switching device 604 is equal to the inductive reactance 614 of the second MEMS switching device 606. Similarly, in this preferred embodiment, the reactance Cu 610 is equal to the reactance Cu 616. In addition, the reactance Cd 612 is equal to the reactance Cd 618. In this preferred embodiment the first and second switching modules, 604 and 606, are switched in phase with one another and as such the same electrostatic actuator (not shown) can be used to activate the MEMS switch contacts in modules 604 and 606 substantially simultaneously. All the MEMS devices may be identical regardless of the desired phase shift value and the required main-line junction impedance values can be realized using the quarter wavelength stub transformers. For the illustrated embodiment in FIG. 6 the phase shift, return loss, peak voltage and current are all dependent upon the magnitude of the switched suceptances at the main transmission path junctions 607 and 609.

The phase shifter 600 can also be cascaded with other phase shifter modules to provide for the synthesis of the appropriate number of phase shift bits required by the particular application. Such phase shifter topologies can accommodate narrow to moderate bandwidth applications. For example, in one embodiment in which the peak power to be transmitted through the phase shifter 600 limited the phase shift bit value to twenty two and one-half degrees, a four bit phase shifter can be created using a cascade of fifteen twenty two and one-half degrees phase shift sections—one section for the 22.5* bit, two sections for the 45* bit, four sections for the 90* bit and eight sections for the 180* bit. By limiting the magnitude of the switched suceptances for any one bit and cascading smaller phase shift sections to realize larger ones, significantly higher power handling capabilities can be achieved with the expense of additional complexity and size.

Figure 7:
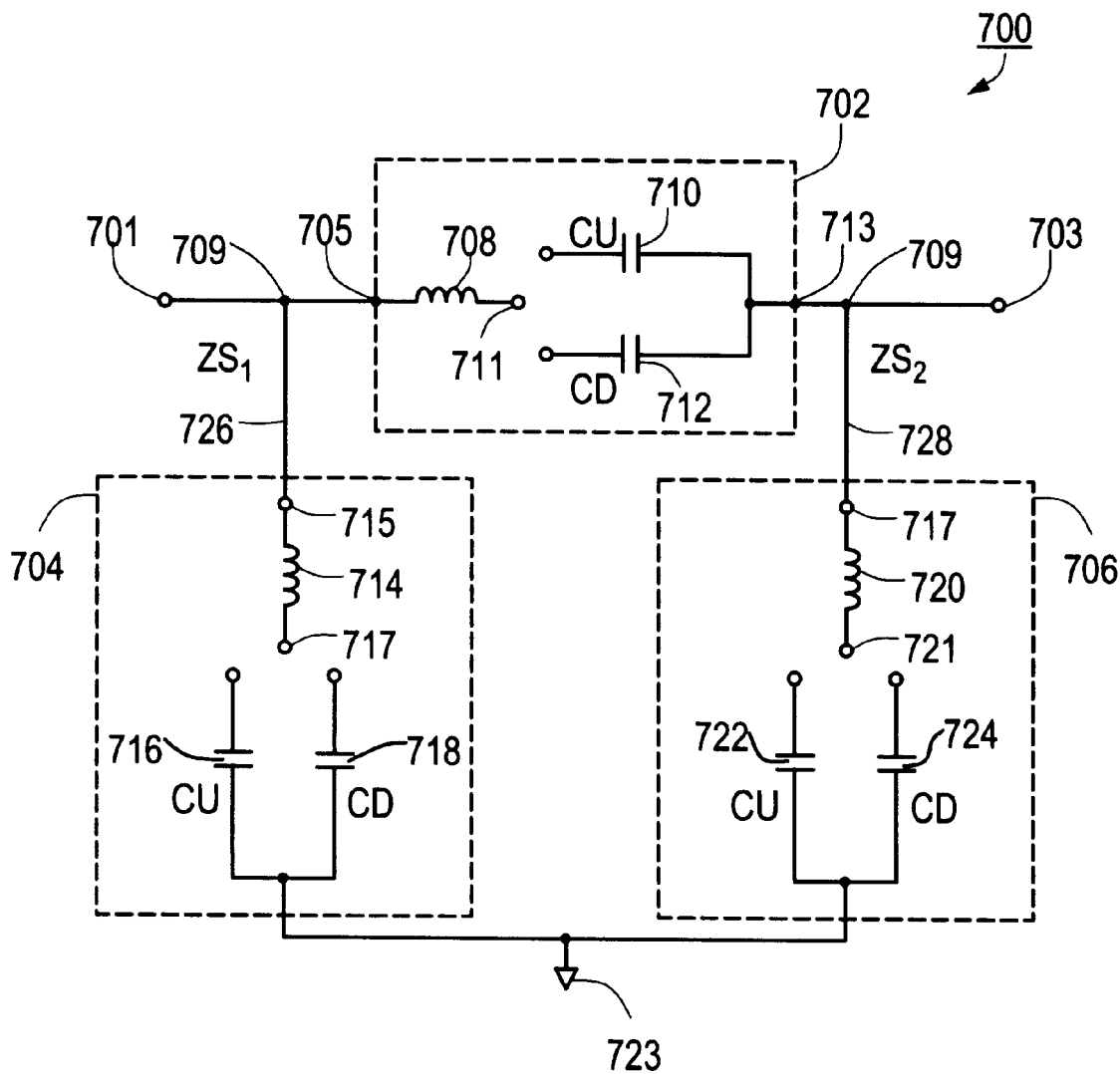
FIG. 7 is a schematic diagram of another embodiment of a phase shifter using the MEMS switch depicted in FIGS. 4A–4B.

FIG. 7 depicts a phase shifter 700 that combines features of the phase shifter architectures depicted in FIGS. 5 and 6. In particular, the phase shifter 700 replaces the quarter wavelength coupling line in the shunt stub embodiment of FIG. 6 with the series switching module of FIG. 5. The consequence of this replacement is a significant size reduction at the expense of adding an additional MEMS switch contact and actuator. In the embodiment of FIG. 7 the series switching module, 702, has an input, 705 and an output, 713. An inductive reactance, 708 is connected in series between the input, 705, and the switching node 711 and is therefore a positive reactance. As discussed above, a dual-state capacitor provides a predetermined capacitive reactance is in series with the inductive reactance 708, wherein the capacitive reactance is dependent upon the position of the switching node 711. The reactance Cu 710 is the capacitive reactance when the switch node 711 is in the up or open position. The reactance Cd 712 is the capacitive reactance when the switch node 711 in the down or closed position. As discussed above, the capacitive reactance determined by Cu 710 is selected to be two to three time larger than the inductive reactance 708 making the combined reactance of the series switching module negative when the switching node 711 is in the open or up position. Alternatively, the capacitive reactance determined by Cd 712 is selected to be significantly smaller than the inductive reactance 708 making the combined reactance of the series switching module positive when the switching node is in the down or closed position.

In the embodiment of FIG. 7 first and second shunt stubs, 726 and 728 respectively, are end loaded by first and second switching modules, 704 and 706 respectively. The first and second shunt stubs 726 and 728 and are positioned as shunts at the input and output ends respectively of the series switching module, 702. The first shunt stub 726 is connected at node 707 to the input transmission line 701, wherein the first shunt stub 726 has an electrical impedance $Z_{s1}$ and is a predetermined electrical length. Preferably, the electrical length is a quarter wavelength, or odd multiple of a quarter wavelength, at the center frequency of the signal band of interest along the first shunt stub 726. The first shunt stub 726 is end loaded with switching module 704 that is connected between the stub end 715 and the reference voltage or ground 723.

The switching module 704 includes the switching input 715 and the switching output 723 coupled to ground, a first inductive reactance 714 connected in series between the input 715 and a switching node 717. First and second reactances Cu 716 and Cd 718 respectively are the switch contact reactance of the MEMS switching contacts. As discussed above the capacitive reactance Cu 716 is the value of the capacitive reactance when the switching node 717 is in the up or open position, and the capacitive reactance Cd 718 is the value of the capacitive reactance when the switching node 717 is in the down or closed position. In the illustrated embodiment the capacitive reactances determined by Cu 716 can be two to three time larger than the inductive reactance 714 making the combined reactance of the series switching module negative when the switching node 717 is in the up or open position. Alternatively, the capacitive reactance determined by Cd 718 is significantly smaller than the inductive reactance making the combined reactance of the series switching module positive when the switching node 717 is in the down or closed position.

The second shunt stub, 728, is connected at node 709 to the output transmission line 703, wherein the second shunt stub has an electrical impedance of $Z_{s2}$ and is a predetermined electrical length. Preferably, the predetermined electrical length is a quarter wavelength, or an odd multiple of a quarter wavelength, at the center frequency of the signal band of interest along the second shunt stub 728. The shunt stub is end loaded with switching module 706 that is connected between the stub end, 717 and the reference voltage or ground 723.

The switching module 706 includes the switching input 717 and the switching output 723 coupled to ground, a first inductive reactance 720 connected in series between the input 717 and a switching node 721. First and second reactances Cu 722 and Cd 724 respectively are the switch contact reactance of the MEMS switching contacts. As discussed above the capacitive reactance Cu 722 is the value of the capacitive reactance when the switching node 721 is in the up or open position, and the capacitive reactance Cd 724 is the value of the capacitive reactance when the switching node 721 is in the down or closed position. In the illustrated embodiment the capacitive reactances determined by Cu 722 can be two to three time larger than the inductive reactance 720 making the combined reactance of the series switching module negative when the switching node 721 is in the up or open position. Alternatively, the capacitive reactance determined by Cd 724 is significantly smaller than the inductive reactance 720 making the combined reactance of the series switching module positive when the switching node 721 is in the down or closed position.

In the embodiment depicted in FIG. 7, all three switching modules, 702, 704 and 706 are switched in phase for normal operation. Accordingly, when the two stub loaded modules, 704 and 706 have their MEMS switch contacts 717 and 721 respectively in the up or open position, the combined reactance is capacitive or negative. However the quarter wavelength stubs transform the capacitive or negative reactances to shunt inductive or positive reactances at the phase shifter input, 701, and output, 703, terminals. Similarly, when the two stub loaded modules, 704 and 706 have their MEMS switch contacts 717 and 721 respectively in the down or closed position, the combined reactance is inductive or positive. However the quarter wavelength stubs transform the inductive or positive reactances to shunt capacitive or negative reactances at the phase shifter input, 701, and output, 703, terminals. Operation of the phase shifter embodiment depicted in FIG. 7 simulates switching between a low-pass network when the MEMS switch contacts are in the down or closed position and a high-pass network when the MEMS switch contacts are in the up or open position and thus contributing the desired phase shift.

Those of ordinary skill in the art should further appreciate that variations to and modification of the above-described methods, apparatus and system for using MEMS switched phase shifters may be made without departing from the inventive concepts disclosed herein. Accordingly, the invention should be viewed as limited solely by the scope spirit of the appended claims.

What is claimed is:

1. A phase shifter comprising:
   a first switching module having a first input and first output and a first predetermined reactance, and a second predetermined reactance having first and second predetermined values, the second reactance being switchable between first and second values, a first switching element operative to switch the second reactance between the first and second values, wherein the combination of the first and second predetermined reactances is coupled between the first input and the first output;

a second switching module having a second input and second output and a third predetermined reactance, and a fourth predetermined reactance having first and second predetermined values, the fourth reactance being switchable between first and second values, a second switching element operative to switch the second reactance between the first and second values, wherein the combination of the third and fourth predetermined reactances is coupled between the second input and the second output, the second input being coupled to the first input and the second output being coupled to a voltage reference;

a third switching module having a third input and third output and a fifth predetermined reactance, and a sixth predetermined reactance having first and second predetermined values, the sixth reactance being switchable between first and second values, a third switching element operative to switch the sixth reactance between the first and second values, wherein the combination of the fifth and sixth predetermined reactances is coupled between the third input and the third output, the third input being coupled to the second output and the third output being coupled to a voltage reference;

the first, second, and third switching elements operative to switch the first, second, and third switching modules respectively to form a network having a desired amount of phase shift.

2. The phase shifter of claim 1 wherein the first reactance is determined by an inductor and the first and second values of the second reactance are determined by first and second capacitors respectively, and wherein the first value of the second reactance is greater than the first reactance and the value of the second reactance is less than the first reactance.

3. The phase shifter of claim 1 wherein the third reactance is determined by an inductor and the first and second values of the fourth reactance are determined by first and second capacitors respectively, and wherein the first value of the fourth reactance is greater than the third reactance and the second value of the fourth reactance is less than the third reactance.

4. The phase shifter of claim 1 wherein the fifth reactance is determined by an inductor and the first and second values of the sixth reactance are determined by first and second capacitors respectively, and wherein the first value of the sixth reactance is greater than the fifth reactance and the second value of the sixth reactance is less than the fifth reactance.

5. The phase shifter of claim 1 wherein the first switching element is a MEMS switch.

6. The phase shifter of claim 1 wherein the second switching element is a MEMS switch.

7. The phase shifter of claim 1 wherein the third switching element is a MEMS switch.

8. The phase shifter of claim 1 wherein the second and third switching elements are switched substantially simultaneously in phase with one another and are switched substantially simultaneously out of phase with the first switching element.

9. A phase shifter for shifting a signal of interest having a center frequency, the phase shifter comprising:

a main transmission line having an input and an output;

a first shunt stub having a first shunt input coupled to the main transmission line, the first shunt stub including a first predetermined electrical length, the first shunt stub having a first shunt output;

a first switching module having a first input coupled to the first shunt output and a first output coupled to a voltage reference, the first switching module further including a first predetermined reactance, and a second predetermined reactance having first and second predetermined values, the second reactance being switchable between first and second values, a first switching element operative to switch the second reactance between the first and second values, wherein the combination of the first and second predetermined reactances is coupled between the first input and the first output;

a second shunt stub having a second shunt input coupled to the main transmission line spaced apart from the first shunt stub a predetermined electrical distance, the second shunt stub having a second shunt output a second switching module having a second input and second output and a third predetermined reactance, and a fourth predetermined reactance having first and second predetermined values, the second reactance being switchable between first and second values, a second switching element operative to switch the second reactance between the first and second values, wherein the combination of the third and fourth predetermined reactances is coupled between the second input and the second output;

the coupling locations of the first and second shunt stubs to the main transmission line being spaced apart from one another by a third predetermined electrical distance;

the first and second switching elements operative to switch the first and second switching modules respectively to form a network having a desired amount of phase shift.

10. The phase shifter, of claim 9 wherein the first reactance is determined by an inductor and the first and second values of the second reactance are determined by first and second capacitors respectively, and wherein the first value of the second reactance is greater than the first reactance and the value of the second value is less than the first reactance.

11. The phase shifter of claim 9 wherein the third reactance is determined by an inductor and the first and second values of the fourth reactance are determined by first and second capacitors respectively, and wherein the first value of the fourth reactance is greater than the third reactance and the value of the second value of the fourth reactance is less than the third reactance.

12. The phase shifter of claim 9 wherein the first predetermined electrical length is an odd integer multiple of a quarter wavelength of the center frequency of the signal of interest.

13. The phase shifter of claim 12 wherein the first predetermined electrical length is a single quarter wavelength of the center frequency of the signal of interest.

14. The phase shifter of claim 9 wherein the second predetermined electrical length is an odd integer multiple of a quarter wavelength of the center frequency of the signal of interest.

15. The phase shifter of claim 14 wherein the second predetermined electrical length is a single quarter wavelength of the center frequency of the signal of interest.

16. The phase shifter of claim 9 wherein the third predetermined electrical length is an odd integer multiple of a quarter wavelength of the center frequency of the signal of interest.

17. The phase shifter of claim 16 wherein the third predetermined electrical length is a single quarter wavelength of the center frequency of the signal of interest.

18. The phase shifter of claim 9 wherein the first and second switching elements are switched substantially simultaneously in phase with one another.

19. A phase shifter for shifting a signal of interest having a center frequency, the phase shifter comprising:

an input transmission line having a first and second end;

an output transmission line having a first and second end;

a first shunt stub having a first shunt input coupled to the input transmission line, the first shunt stub including a first predetermined electrical length, the first shunt stub having a first shunt output;

a first switching module having a first input coupled to the first shunt output and a first output coupled to a voltage reference point, the first switching module further including a first predetermined reactance, and a second predetermined reactance having first and second predetermined values, the second reactance being switchable between first and second values, a first switching element operative to switch the second reactance between the first and second values, wherein the combination of the first and second predetermined reactances is coupled between the first input and the first output;

a second shunt stub having a second shunt input coupled to the output transmission line, the second shunt stub having a second shunt output;

a second switching module having a second input and second output, the second input being coupled to the second shunt output and the second output being coupled to a voltage reference point, the second switching module further including a third predetermined reactance, and a fourth predetermined reactance having first and second predetermined values, the second reactance being switchable between first and second values, a second switching element operative to switch the second reactance between the first and second values, wherein the combination of the third and fourth predetermined reactances is coupled between the second input and the second output;

a third switching module having a third input and third output, the third input being coupled to the second end of the input transmission line and the third output being coupled to the first end of the output transmission line, the third switching module further including a fifth predetermined reactance, and a sixth predetermined reactance having first and second predetermined values, the second reactance being switchable between first and second values, a second switching element operative to switch the second reactance between the first and second values, wherein the combination of the fifth and sixth predetermined reactances is coupled between the second input and the second output;

the first, second, and third switching elements operative to switch the first, second, and third switching modules respectively to form a network having a desired amount of phase shift.

20. The phase shifter of claim 19 wherein the first reactance is determined by an inductor and the first and second values of the second reactance are determined by first and second capacitors respectively, and wherein the first value of the second reactance is greater than the first reactance and the value of the second value is less than the first reactance.

21. The phase shifter of claim 19 wherein the third reactance is determined by an inductor and the first and second values of the fourth reactance are determined by first and second capacitors respectively, and wherein the first value of the fourth reactance is greater than the third reactance and the value of the second value of the fourth reactance is less than the third reactance.

22. The phase shifter of claim 19 wherein the fifth reactance is determined by an inductor and the first and second values of the sixth reactance are determined by first and second capacitors respectively, and wherein the first value of the sixth reactance is greater than the fifth reactance and the value of the second value of the sixth reactance is less than the fifth reactance.

23. The phase shifter of claim 19 wherein the first predetermined electrical length is an odd integer multiple of a quarter wavelength of the center frequency of the signal of interest.

24. The phase shifter of claim 23 wherein the first predetermined electrical length is a single quarter wavelength of the center frequency of the signal of interest.

25. The phase shifter of claim 19 wherein the second predetermined electrical length is an odd integer multiple of a quarter wavelength of the center frequency of the signal of interest.

26. The phase shifter of claim 25 wherein the second predetermined electrical length is a single quarter wavelength of the center frequency of the signal of interest.

27. The phase shifter of claim 19 wherein the first, second, and third switching elements are switched substantially simultaneously in phase with one another.

* * * * *